US010653039B2

(12) United States Patent
Leigh et al.

(10) Patent No.: US 10,653,039 B2
(45) Date of Patent: May 12, 2020

(54) BASE LAYER ARCHITECTURE INFRASTRUCTURE DEVICE

(71) Applicant: HEWLETT-PACKARD DEVELOPMENT COMPANY, L.P., Houston, TX (US)

(72) Inventors: Kevin B. Leigh, Houston, TX (US); George D. Megason, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 493 days.

(21) Appl. No.: 14/898,686

(22) PCT Filed: Jul. 15, 2013

(86) PCT No.: PCT/US2013/050505
§ 371 (c)(1),
(2) Date: Dec. 15, 2015

(87) PCT Pub. No.: WO2015/009278
PCT Pub. Date: Jan. 22, 2015

(65) Prior Publication Data
US 2016/0150681 A1 May 26, 2016

(51) Int. Cl.
*H05K 7/20* (2006.01)
*H05K 7/14* (2006.01)

(52) U.S. Cl.
CPC ....... *H05K 7/20709* (2013.01); *H05K 7/1492* (2013.01); *H05K 7/20509* (2013.01)

(58) Field of Classification Search
CPC .......... H05K 7/20636; H05K 7/20645; H05K 7/1457; H05K 7/1492

USPC .................................................. 361/679.46
See application file for complete search history.

(56) References Cited

U.S. PATENT DOCUMENTS

| 8,432,791 | B1 | 4/2013 | Masters |
| 8,457,174 | B2 | 6/2013 | DeCusatis et al. |
| 2004/0219415 | A1 | 11/2004 | Brignone et al. |
| 2011/0209852 | A1 | 9/2011 | Enlund |
| 2011/0304211 | A1 | 12/2011 | Peterson et al. |

(Continued)

OTHER PUBLICATIONS

International Searching Authority, The International Search Report and the Written Opinion, dated Apr. 16, 2014, 12 Pages.

(Continued)

*Primary Examiner* — Mukundbhai G Patel
(74) *Attorney, Agent, or Firm* — Hewlett Packard Enterprise Patent Department (57) ABSTRACT

A base layer architecture (BLA) infrastructure device comprises a power base layer (PBL) to supply power to a cartridge, a cold thermal base layer (cold TBL) to cool the cartridge, a hot thermal base layer (hot TBL) to remove heat from the cartridge, an optical base layer (OBL) to transmit an optical signal to the cartridge and a radio frequency base layer (RBL) to transmit a radio frequency signal to the cartridge. Each base layer comprises a rack interface to couple the base layer to a rack and a number of cartridge interfaces to couple the base layers to the cartridge. A BLA infrastructure system comprises a BLA infrastructure device comprising a number of base layers. The number of base layers are removably coupled to a rack and a system management device to manage the number of base layers.

16 Claims, 6 Drawing Sheets

(56) References Cited

U.S. PATENT DOCUMENTS

| | | |
|---|---|---|
| 2012/0009862 A1 | 1/2012 | Meyer |
| 2012/0075795 A1* | 3/2012 | Petruzzo ................ G06F 1/181 361/679.48 |
| 2012/0134085 A1 | 5/2012 | Gau et al. |
| 2013/0025818 A1* | 1/2013 | Lyon ................ H05K 7/20781 165/11.1 |
| 2013/0027204 A1 | 1/2013 | Groth et al. |

OTHER PUBLICATIONS

Larsen, L.; Open Rack Approaches for Maximizing the Efficiency of Equipment in a Cold-Aisle Hot-aisle Data Center Environment; (Research Paper); Jun. 2008.

* cited by examiner

BASE LAYER ARCHITECTURE INFRASTRUCTURE DEVICE

BACKGROUND

Today's businesses are using increasingly complex computing infrastructures to complete their day-to-day tasks. Accordingly, businesses often utilize data centers to manage these complex infrastructures. Data centers often include rack cabinets, or racks, that store and connect the various electronic devices that make up a computing infrastructure. For example, a rack may include blade servers, storage systems, and network systems that assist the business in carrying out complex electronic functions. The racks supply electrical power and transmit/receive signals that allow these electronic devices to operate. Additionally, the components and the electronic devices are cooled to alleviate any potential malfunction. Simplifying the rack and electronic device infrastructure is beneficial as it enhances the efficiency of power and signal propagation throughout the infrastructure, and more efficiently cools the system thus reducing the risk of overheated systems.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Data centers use racks to store and control electronic device components including processors, memory, input/output devices, and storage devices. Multiple electronic devices can be stacked either vertically or horizontally into a rack. Additionally, the rack supplies electrical power to the electronic devices and their components, and transmits signals to and from the electronic devices and components. The rack also performs a temperature regulation function for the electronic devices. For example, cold air or liquid is pumped into the rack. The moving air or liquid cools the components and the heated exhaust air is expelled from the rack.

However, the current temperature management, power management, and signal management methods for a rack may generate certain inefficiencies. For example, there are many variables that reduce the effectiveness of component cooling functions. These variables include, but are not limited to, component placement, component density, and thermal impedance, among other variables. An example is given as follows. Pushing cooling air from the front of the rack to the back of the rack in a system chassis subjects components placed farther back in the racks to cooling air that has been heated by the components near the front of the rack. This reduces the cooling effect of the air on the downstream components. In this example, the downstream components that have the worst-case thermal environment may limit the performance of a computing device (e.g., server blade, storage device, network device). As such, other heat extraction devices may be implemented to increase the cooling effect.

An additional inefficiency is the congestion created by the number of components in a rack and provisioning electrical power and signal transmission lines to and from the components. The addition of supplemental heat extraction devices exacerbates the congestion by occupying valuable space in the rack. These, and other variables, affect the cooling efficiency which can be measured in terms of power consumption, monetary cost, and component power density, among others.

Thus, the present disclosure describes a base layer architecture (BLA) infrastructure device. The BLA infrastructure device comprises a power base layer (PBL) to supply power to cartridges. The BLA infrastructure device also comprises a cold thermal base layer (cold TBL) and a hot thermal base layer (hot TBL) to cool the cartridges and remove heat from the cartridges. An optical base layer (OBL) and a radio frequency base layer (RBL) transmit and receive optical signals and radio frequency signals to and from the cartridges. Each base layer comprises an interface that couples the base layer to the rack, either independently or collectively with a number of other base layers. Each base layer also comprises a number of cartridge interfaces that couple the base layers to the cartridges.

The present disclosure also describes a computer program product for managing a BLA infrastructure device. The computer program product comprises a computer readable storage medium including computer usable program code that, when executed by a processor, controls a resource to a cartridge via a rack and a base layer. The resource may be, for example, an optical signal or a radio frequency signal, electrical power, or a cooling fluid. The computer usable program code receives feedback from the cartridge relating to the supplied resource. Based on the feedback, the computer program product may utilize computer usable program code to manage a number of base layers in a BLA infrastructure device.

As used in the present specification and in the appended claims, the term "fluid" is meant to be understood broadly as any substance, such as, for example, a liquid or air, that is capable of flowing and that changes its shape at a steady rate when acted upon by a force tending to change its shape. In one example, any number of fluids may be used to cool the cartridges. For example, the cooling fluid may be air or a liquid.

Further, as used in the present specification and in the appended claims, the term "cartridge" is meant to be understood broadly as any modular electronic component and/or circuitry that carries out a function. Examples of functions that may be carried out by a cartridge include power conversion, computation, memory storage, input/output management, system management, or a combination thereof.

Even further, as used in the present specification and in the appended claims, the term "base layers" or similar language is meant to be understood broadly as including the PBL, the cold TBL, the hot TBL, the OBL, the RBL, or combinations thereof. Similarly, the term "rack interfaces" or similar language is meant to be understood broadly as including the PBL rack interface, the cold TBL rack interface, the hot TBL rack interface, the OBL rack interface, the RBL rack interface, or combinations thereof on the base layers or in the rack. The term "cartridge interfaces" or similar language is meant to be understood broadly as including the PBL cartridge interface, the cold TBL cartridge interface, the hot TBL cartridge interface, the OBL cartridge interface, the RBL cartridge interface, and combinations thereof on the base layers. Lastly, the term "base layer interfaces" or similar language is meant to be understood broadly as including the PBL interface, the cold TBL interface, the hot TBL interface, the OBL interface, the RBL interface, or combinations thereof on the cartridges.

Even further, as used in the present specification and in the appended claims, the term "rack" or similar language is meant to be understood broadly as a structure that houses a number of BLA infrastructure devices and a number of cartridges therein. The rack serves as a gateway for electrical power, transmission signals, a cooling fluid for the BLA infrastructure device, or any combination thereof. An example of a rack is given as follows. A server blade system uses multiple printed circuit boards in various orientations to contain and connect electronic components including processors, memory devices, input/output devices, and storage devices. These blades are used in blade enclosures that are mounted in racks. The racks are arranged in datacenter rooms.

Even still further, as used in the present specification and in the appended claims, the term "a number of" or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Figure 1:
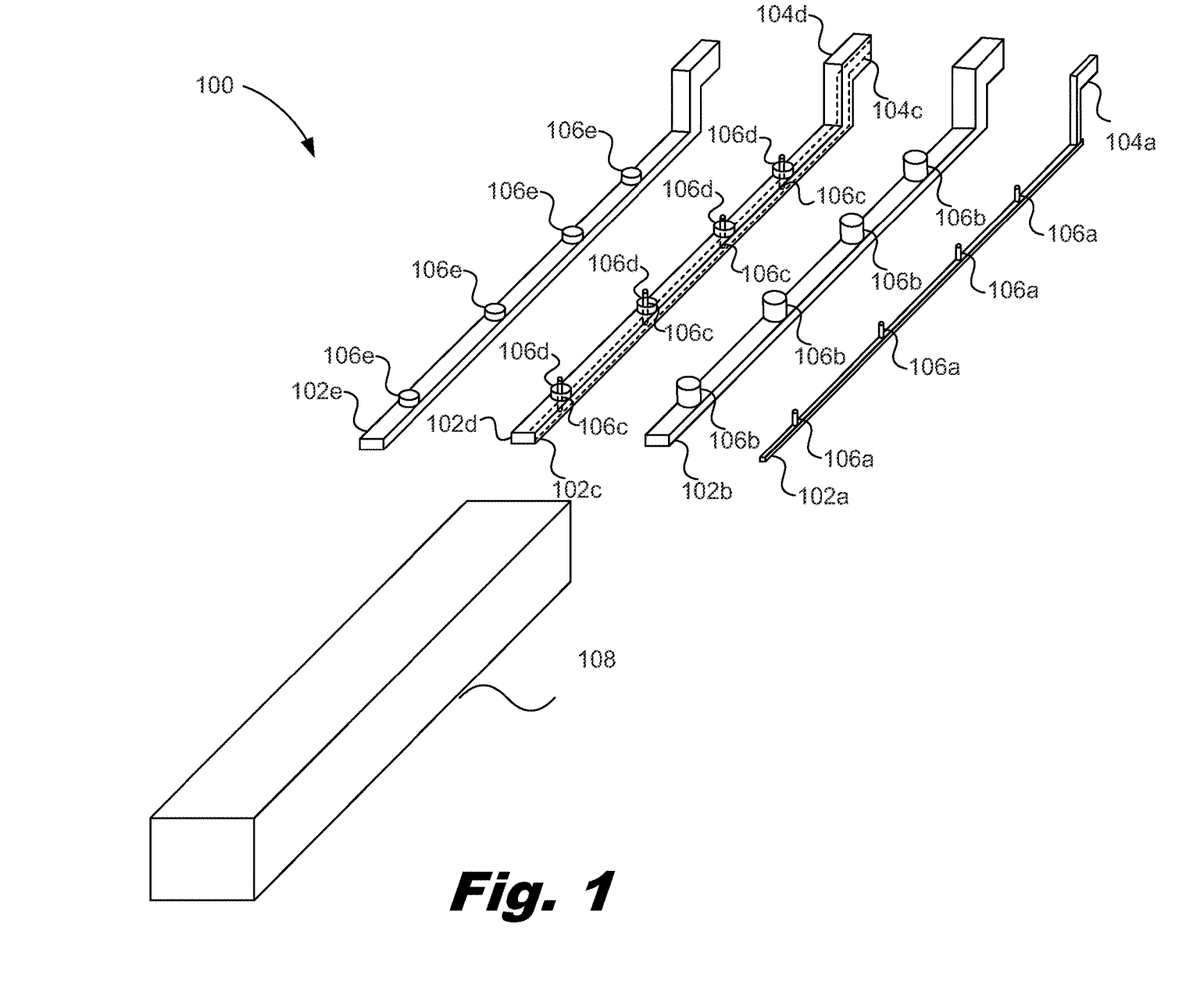
FIG. 1 is a diagram of a base layer architecture infrastructure device, according to one example of the principles described herein.

Turning now to the figures, FIG. 1 is a block diagram of a BLA infrastructure device (100), according to one example of the principles described herein. The BLA infrastructure device (100) implements the base layers (102), as disclosed herein. The BLA infrastructure device (100) comprises a number of base layers (102) that supply resources to a number of cartridges coupled to the base layers (102). For example, the BLA infrastructure device (100) comprises a power base layer (PBL) (102a), an optical base layer (OBL) (102b), a radio frequency base layer (RBL) (102c), a cold thermal base layer (cold TBL) (102d), and a hot thermal base layer (hot TBL) (102e). In one example, a base layer (102) may be embedded in another base layer (102) to form an integrated base layer (102). For example, as depicted in FIG. 1, the RBL (102c) may be embedded in the cold TBL (102d) to form an integrated base layer. In FIG. 1, the RBL (102c) is indicated by the dashed line. Other examples of base layers (102) that may be joined to form an integrated base layer include the RBL (102c) embedded in the hot TBL (102e), the RBL (102c) embedded in the OBL (102b), the PBL (102a) embedded in the hot TBL (102e) if the cooling fluid is air, the PBL (102a) embedded in the cold TBL (102d) if the cooling fluid is air, the PBL (102a) embedded in the OBL (102b), and the OBL (102b) embedded in the hot TBL (102e) if the cooling fluid is air, and the OBL (102b) embedded in the cold TBL (102d) if the cooling fluid is air.

A general description of the base layers (102) is given as follows. Each base layer (102) comprises a rack interface (104) that removably couples the base layer (102) to a rack. Accordingly, via the rack interface (104) and a corresponding interface on the rack, a base layer (102) is mechanically coupled to the rack. The rack interface (104) also aligns the base layer (102) with the rack. Accordingly, a rack interface (104) may comprise different alignment features, such as a specific interface geometry or interface size, to align a base layer (102) to the rack. In some examples, the rack interface (104) may comprise a blind-mate connector to align, and mechanically couple, the base layer (102) to the rack. For example, the rack interface (104) may comprise a hollow receptacle. A corresponding interface (not shown) of a rack may comprise a protrusion that is received into the receptacle. Via the rack interface (104), a base layer (102) receives a resource from a source.

As depicted in FIG. 1, each base layer (102) may have a unique rack interface (104) such that each base layer (102) individually interacts with the rack. In another example, as will be described in connection with FIG. 4, a set of rack interfaces (104) may be consolidated into an integrated rack interface (104). In some examples, the BLA infrastructure device (100) may comprise multiple sets of rack interfaces (104).

Each base layer (102) comprises a number of cartridge interfaces (106) that allow a number of cartridges to removably couple from the base layer (102). Accordingly, via the cartridge interfaces (106) and corresponding interfaces on the cartridges, a number of cartridges are mechanically coupled to a base layer (102). The cartridge interfaces (106) also align the cartridges with the base layer (102). Accordingly, the cartridge interfaces (106) may comprise different alignment features such as a specific interface geometry or interface size, to align the cartridges to the base layer (102). In some examples, the cartridge interfaces (106) may comprise a blind-mate connector to align, and mechanically couple, the base layer (102) to a number of cartridges. For example, a cartridge interface (106) may comprise a protrusion from a surface of the base layer (102). A corresponding interface (not shown) in the cartridge may comprise a receptacle that receives the protrusion. Via the cartridge interface (106), a base layer (102) supplies a resource to a cartridge.

A base layer (102) may support multiple cartridges. For example, each base layer (102) may comprise four cartridge interfaces (106) as depicted in FIG. 1. Accordingly, each base layer (102) may support four cartridges. In another example, a cartridge may utilize multiple cartridge interfaces (106) to interact with the base layer (102). For example, a cartridge may utilize two cartridge interfaces (106) on each base layer (102). In this example, a base layer (102) with four cartridge interfaces (106), as depicted in FIG. 1, would support three cartridges.

A detailed description of each of the base layer (102) types is given as follows. The PBL (102a) provides electrical power to a number of cartridges. The PBL (102a) comprises a PBL rack interface (104a) that receives electrical power from the rack. In this fashion, the PBL (102a) is electrically and mechanically coupled to the rack. The PBL (102a) also comprises a number of PBL cartridge interfaces (106a) that supply electrical power to the number of cartridges. In this fashion, the PBL (102a) is electrically and mechanically coupled to the cartridges. The PBL (102a) may comprise a power transmission element that supplies power to the cartridge. For example, the PBL (102a) may comprise an electrical cable. In another example, the PBL (102a) may be a conduit made of a material that conducts electricity. The PBL rack interface (104a) may be a high voltage direct current (HVDC) interface. In other words, the PBL rack interface (104a) may receive high voltage direct current from a source. The cartridge may operate using low voltage direct current (LVDC) interfaces. Accordingly, as will be described below, the cartridge may have a power converter that converts the HVDC to LVDC.

In one example, a cartridge (210a) may receive the HVDC from a first segment of the PBL (102a) via a first PBL cartridge interface (106a). The cartridge (210a) may then convert the HVDC to LVDC and distribute the LVDC to other cartridges (210b, 210c) via a second PBL cartridge interface (106a'). In this example, the first segment of the PBL (102a) receives a HVDC and the second segment of the PBL (102a') supplies a LVDC.

The OBL (102b) transmits/receives optical signals to/from the cartridges and the rack. Accordingly, the OBL (102b) may comprise transmission lines that transmit and receive optical signals between the rack and the cartridges. The OBL (102b) comprises an OBL rack interface (104b) that receives and transmits optical signals to and from the rack. In this fashion, the OBL (102b) is optically and mechanically coupled to the rack. The OBL (102b) also comprises cartridge interfaces (106b) that receive and transmit optical signals to and from a number of cartridges. In this fashion, the OBL (102b) is optically and mechanically coupled to the cartridges. The OBL (102b) may comprise any device that propagates an optical signal. For example, the OBL (102b) may be a hollow metallic channel coated with an optically transmissive material. Other examples of devices that propagate an optical signal include, but are not limited to, optical glass fibers, optical plastic fibers, and polymer waveguides, among other optical signal propagation devices. The OBL (102b) may comprise any device that modifies an optical signal. Examples of devices that modify an optical signal include, but are not limited to, a wavelength multiplexer, a wavelength demultiplexer, a bus, a switch, a splitter, a combiner, a transponder, an amplifier, among other optical signal modification devices.

The RBL (102c) transmits radio frequency signals to and from the cartridges and a rack. Accordingly, the RBL (102c) may comprise transmitting antennae that transmit radio frequency signals and receiving antennae that receive radio frequency signals. The RBL (102c) comprises an RBL rack interface (104c) that transmits and receives radio frequency signals to and from the rack. In this fashion, the RBL (102c) is mechanically coupled to the rack and via a radio frequency link. The RBL (102c) also comprises a number of RBL cartridge interfaces (106c) that transmits and receives radio frequency signals to and from a number of cartridges. In this fashion, the RBL (102c) is mechanically and electromagnetically coupled to the cartridges and via a radio frequency link. The RBL (102c) may be a hollow metallic channel or a coaxial cable. The RBL (102c) may comprise any device that propagates a radio frequency signal. The radio frequency signal may be one or multiple channels using different frequencies or different modulation methods such as spread spectrum. The RBL (102c) may also comprise any device that modifies a radio frequency signal, such as an amplifier, a transponder, a multiplexer, a demultiplexer, among other radio frequency signal modifying devices.

As depicted in FIG. 1, in some examples the RBL (102c) may be embedded in another base layer (102) to form an integrated base layer. In this example, the RBL cartridge interfaces (106c) may protrude through the other base layer cartridge interfaces (106). For example, in the case that a RBL (102c) is embedded in a cold TBL (102d), the RBL cartridge interfaces (106c) may protrude through the cold TBL cartridge interfaces (106d) to transmit/receive radio frequency signals to/from the cartridges. Similarly, the RBL rack interface (104c) may protrude through the cold TBL rack interface (104d) to transmit/receive radio frequency signals to/from the rack.

The cold TBL (102d) cools the cartridges. In one example, the cold TBL (102d) cools the cartridges via compressed air. In another example, the cold TBL (102d) cools the cartridges via liquid. Other cooling media may be used as an application dictates. The cold TBL (102d) comprises a cold TBL rack interface (104d) that receives a cooling fluid from the rack. For example, the cold TBL rack interface (104d) may be a fluid intake nozzle. The cooling fluid is then propagated through the cold TBL (102d) and is distributed to the cartridges via the cold TBL cartridge interfaces (106d).

In conjunction with the cold TBL (102d), the hot TBL (102e) removes heat from the cartridges. As the cooling fluid (liquid or air) passes through the cartridges, the exhaust heat is passed from the cartridges to the hot TBL (102e) via the hot TBL cartridge interfaces (106e). The exhaust heat is then expelled to the rack via the hot TBL rack interfaces (104e). For example, the hot TBL rack interface (104e) may be a fluid exhaust nozzle. The cold TBL (102d), hot TBL (102e), or combinations thereof may comprise fluid flow management devices such as a fan, a valve, a pump, among other fluid flow management devices to regulate the fluid flow through the cartridges and the rack.

While FIG. 1 depicts a PBL (102a), an OBL (102b), a RBL (102c), a cold TBL (102d), and a hot TBL (102e), the BLA infrastructure device (100) may comprise other base layers. For example, the BLA infrastructure device (100) may comprise an electrical base layer (EBL, not shown), such as a printed circuit board (PCB). In another example, the BLA infrastructure device (100) may comprise a mechanical base layer (MBL, not shown), such as a set of mechanical brackets, magnetic retention devices, etc.

In one example, the BLA infrastructure device (100) may comprise a housing (108) that houses the base layers. The housing (100) may comprise an electrically insulating material. Additionally, the housing (100) may comprise a thermally insulating material, and/or a RF shielding material.

Implementing the BLA infrastructure device (100) as described herein may be beneficial as it increases the effect of a cooling function by reducing the effects of a pre-heated cooling fluid. The BLA infrastructure device (100) also alleviates the need for a large motherboard PCB. Moreover, the BLA infrastructure device (100) promotes efficient power distribution, power conversion, and network connectivity management. Furthermore, the BLA infrastructure device (100) may be beneficial as it allows more flexibility in rack design. For example, the BLA infrastructure device (100) increases the options for fan placement and electronic devices (e.g., server blades, network devices, and storage devices). For example, electronic devices may be installed on either the front or back of the rack. Additionally, the use of cold aisles and hot aisles in a data center may be eliminated, allowing for more efficient data center usage and cooling.

Figure 2:
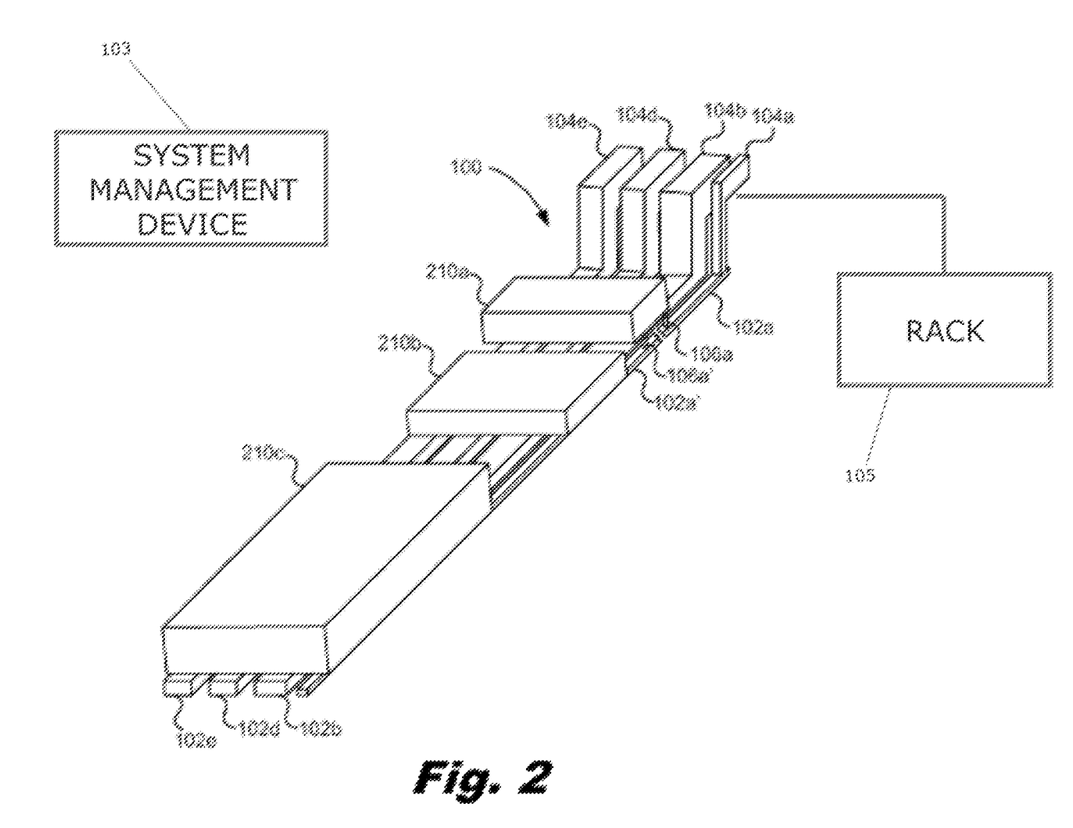
FIG. 2 is a diagram of a base layer architecture infrastructure device and a number of cartridges, according to one example of the principles described herein.

FIG. 2 is a diagram of a BLA infrastructure device (100) and a number of cartridges (210), according to one example of the principles described herein. As described above and in FIG. 1, the BLA infrastructure device (100) comprises a PBL (102a), an OBL (102b), an RBL (FIG. 1, 102c) integrated in the cold TBL (102d), a cold TBL (102d), and a hot TBL (102e). Similarly, the BLA infrastructure device (100) comprises a PBL rack interface (104a), an OBL rack interface (104b), an RBL rack interface (FIG. 1, 104c) integrated in the cold TBL rack interface (104d), a cold TBL rack interface (104d), and a hot TBL rack interface (104e).

As described above, a number of cartridges (210) may be removably coupled to the base layers (102) via a number of cartridge interfaces (FIG. 1, 106). For example, the cartridge interfaces (FIG. 1, 106) on the base layer (102) may comprise protrusions emanating from one surface of the base layer (102). The cartridges (210) may have corresponding receptacles that receive the protrusions. In this fashion, the cartridge interfaces (FIG. 1, 106) and the receptacles on the cartridges (210) couple the cartridges (210) to the base layers (102). More specifically, the cartridge interfaces (FIG. 1, 106) and the receptacles mechanically, optically, electrically, thermally and electro-magnetically couple the cartridges (210) to the base layers (102). In one example, the BLA infrastructure device (100) comprises a socket that receives the cartridges (210).

In one example, a cartridge (210a, 210b) comprises one receptacle for each base layer (120) type. For example, with reference to FIG. 2, the cartridges (210) comprise a PBL receptacle (not shown), an OBL receptacle (not shown), a cold TBL receptacle (not shown) (including an embedded RBL receptacle (not shown)), and a hot TBL receptacle (not shown). Such a cartridge (210a, 210b) may be referred to as a single-size cartridge (210a, 210b). In another example, a cartridge (210) may comprise a number of receptacles for each base layer (120) type. For example, a cartridge (210c) may comprise two PBL receptacles (not shown), two OBL receptacles (not shown), two cold TBL receptacles (not shown) (including two embedded RBL receptacles (not shown)), and two hot TBL receptacles (not shown). Such a cartridge (210c) may be referred to as a double-size cartridge (210c). In some examples, a BLA infrastructure device (100) may be defined by the number of single-size cartridges (210a, 210b) that it supports. For example, the BLA infrastructure device (100) of FIG. 1 and FIG. 2 may be referred to as a one wide four deep BLA infrastructure device (100) referring to the number of cartridges (210) supported along different axes.

As described above, the cartridges (210) may perform various electronic operations. Examples of functions carried out by a cartridge (210) include, but are not limited to, power conversion, computing functions, memory storage, input/output management, and system management, among other functions, or a combination thereof. More detail concerning the composition of a cartridge (210) is given in connection with FIG. 5. The use of modular cartridges (210) and base layers (102) as described herein may be beneficial as it allows for flexible sizing and placement of electronic components within each rack. Additionally, the modular cartridges (210) alleviate the need for a motherboard PCB for power and signal connectivity. The modular cartridges (210) and BLA architecture device (100) also allow for scalability to match a network infrastructure.

Figure 3:
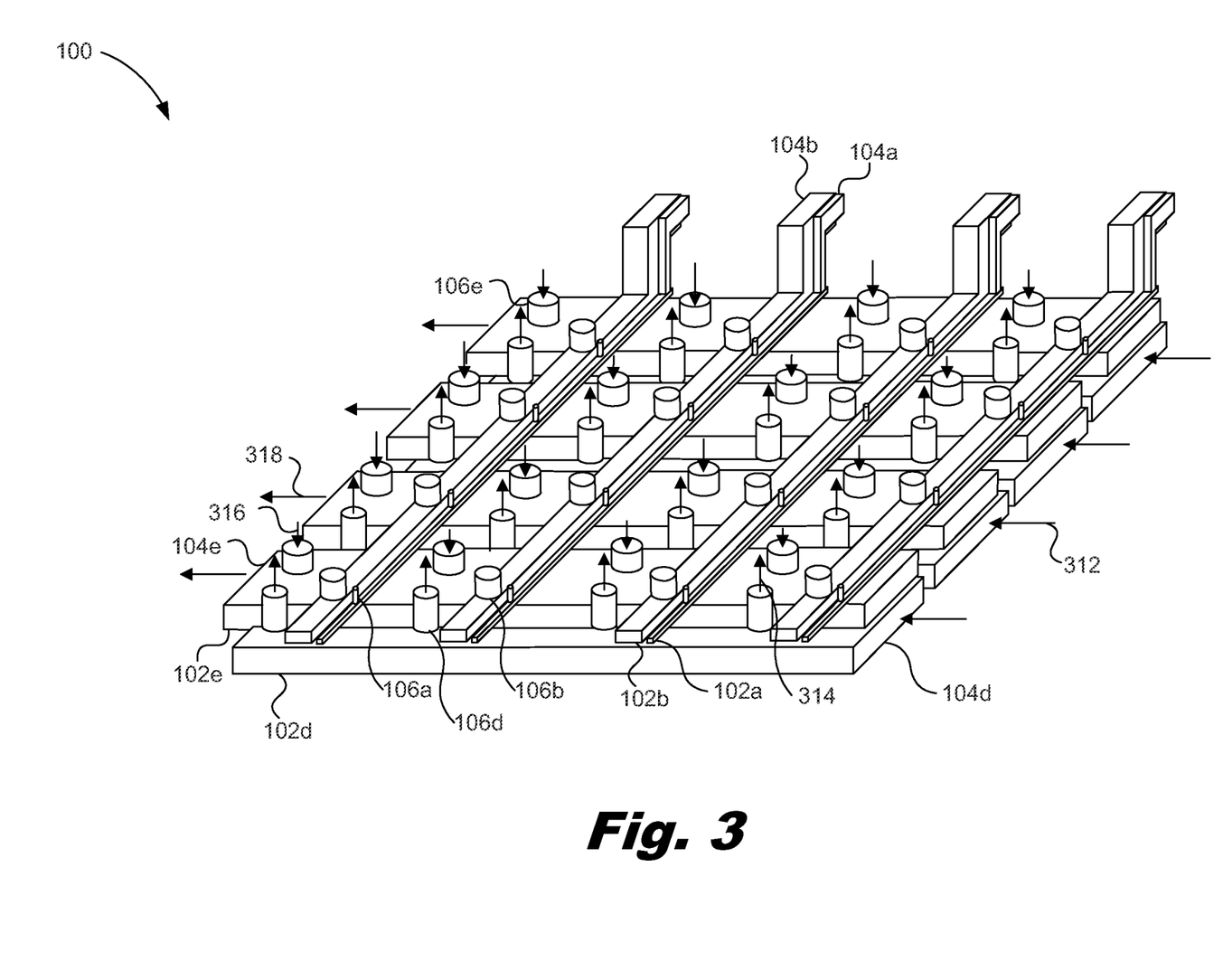
FIG. 3 is a diagram of a base layer architecture infrastructure device, according to one example of the principles described herein.

FIG. 3 is a diagram of a BLA infrastructure device (100), according to one example of the principles described herein. As described above, a BLA infrastructure device (100) may be defined by the number of single-size cartridges (FIG. 2, 210a, FIG. 2, 210b) that it supports. Accordingly, the BLA infrastructure device (100) of FIG. 3 may be referred to as a four wide four deep BLA infrastructure device (100) referring to the number of cartridges (FIG. 2, 210) supported along different axes. The BLA infrastructure device (100) may comprise multiple base layers (102) of a particular type. For example, the BLA infrastructure device (100) may comprise a number of PBLs (102a), a number of OBLs (102b), a number of cold TBLs (102d) and a number of hot TBLs (102e). The BLA infrastructure device (100) may also comprise a number of RBLs (FIG. 1, 102c) integrated into other base layers (102). For simplicity, in FIG. 3, one base layer (102) of teach type is indicated with a reference numeral. In FIG. 3, a single-size cartridge interface (106) for a base layer (102) type is indicated with a reference numeral. In other words, one PBL cartridge interface (106a), one OBL cartridge interface (106b), one cold TBL cartridge interface (106d), and one hot TBL cartridge interface (106e) is indicated with a reference numeral. Similarly, a single rack interface (104) for a base layer (102) type is indicated with a reference numeral. In other words, one PBL rack interface (104a), one OBL rack interface (104b), one cold TBL rack interface (104d), and one hot IBL rack interface (106e) is indicated in FIG. 3.

In one example, the BLA infrastructure device (100) may comprise a number of base layers (102) aligned distinctly from a number of other base layers (102). For example, a number of cold TBLs (102d) and a number of hot TBLs (102e) are aligned perpendicular to a number of PBLs (102a) and a number of OBLs (102b). The cold TBLs (102d) and the hot TBLs (102e) may be aligned for side-to-side fluid flow in a BLA infrastructure device and in a rack.

FIG. 3 also depicts the cooling function of the cold TBL (102d) and the hot TBL (102e). A cooling fluid may enter the cold TBL rack interfaces (104d) as indicated by the horizontal arrows (312) on the right. For simplicity, one horizontal arrow (312) is indicated with a reference numeral. The cooling fluid may originate from cold fluid plenums of a rack (not shown). The cooling fluid then passes through the cold TBLs (102d) to the cold TBL cartridge interfaces (106d) where it is supplied to the cartridges (FIG. 2, 210). The cooling fluid then passes to the cartridges (FIG. 2, 210) as indicated by the upward vertical arrows (314) and is passed through the cartridges (FIG. 2, 210), cooling them. For simplicity, one upward vertical arrow (314) is indicated with a reference numeral.

Heat generated by the components within each cartridge (FIG. 2, 210) is extracted by the cooling fluid. As described above, the cooling fluid may be liquid or air. Accordingly, the cartridges (FIG. 2, 210) comprise a liquid cooling system or an air cooling system. For example, a cartridge (FIG. 2, 210) may comprise a conduit to direct compressed cooling air throughout the cartridge. In another example, air may be directed throughout the cartridge by the placement of different components in the cartridge (FIG. 2, 210).

A liquid cooling system may be a dry-connect type or a wet-connect type. In a dry-connect system, a rack utilizes a pressure-mated material (e.g., cold plates in the rack bays and heat plates on the cartridges (FIG. 2, 210)) to extract heat from the cartridges (FIG. 2, 210). In a wet-connect system like the one depicted in FIG. 3, the cold TBL cartridge interface (106d) and the hot TBL cartridge interface (106e) may comprise plumbing that takes cooling liquid into the cartridge (FIG. 2, 210) and exhausts heated liquid from the cartridge (FIG. 2, 210).

After extracting the heat from the cartridge (FIG. 2, 210) components, the newly heated fluid is routed back to the hot TBL cartridge interfaces (106e) as indicated by the downward vertical arrows (316). For simplicity, one downward vertical arrow (316) is indicated with a reference numeral.

The heated fluid from the cartridges (FIG. 2, 210) then passes through the hot TBLs (102e) and is expelled from the hot TBL rack interfaces (104e) as indicated by the horizontal arrows (318) on the left. For simplicity, one horizontal arrow (318) is indicated with a reference numeral. The heated fluid may pass to hot air plenums of a rack (not shown).

Figure 4:
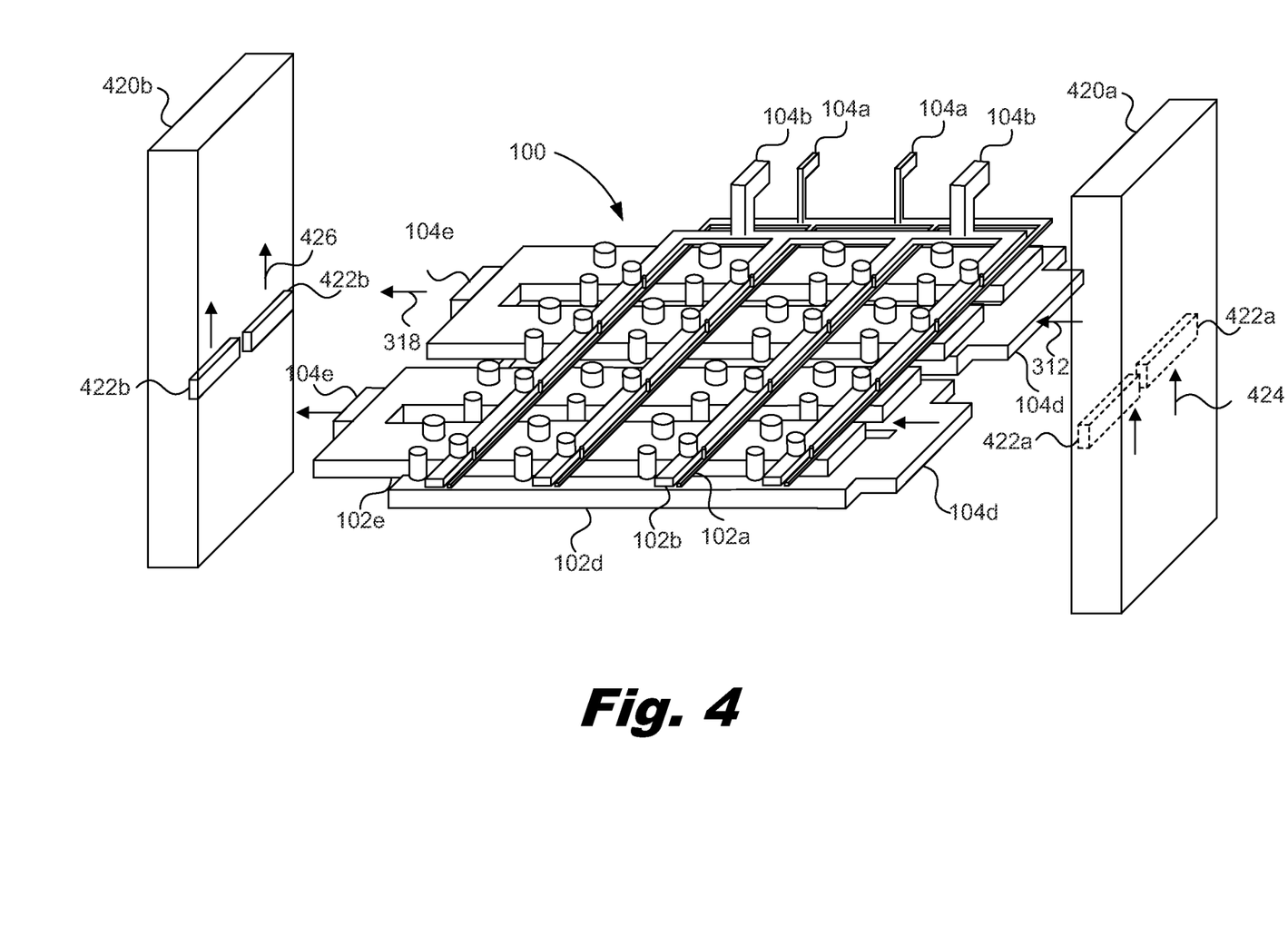
FIG. 4 is a diagram of a base layer architecture infrastructure device and fluid plenums, according to one example of the principles described herein.

FIG. 4 is a diagram of a BLA infrastructure device (100) and fluid plenums (420), according to one example of the principles described herein. As described above, the BLA infrastructure device (100) may comprise a number of base layers (102) that comprise rack interfaces (104). In some examples, a number of base layers (102) may interact with a rack via an integrated rack interface (104). More specifically, a number of base layers (102) may interact with the rack via a number of rack interfaces (104) that is less than number of base layers (102). For example, as depicted in FIG. 4, the BLA infrastructure device (100) may comprise four PBLs (102a). Only one PBL (102a) is indicated with a reference numeral for simplicity. The four PBLS (102a) may receive power from a rack via two PBL rack interfaces (104a).

Similarly, the BLA infrastructure device (100) may comprise four OBLs (102b). Only one OBL (102b) is indicated with a reference numeral for simplicity. The four OBLs (102b) may receive/transmit optical signals to/from the rack via two OBL rack interfaces (104b). Similarly, the BLA infrastructure device (100) may comprise four cold TBLs (102d). Only one cold TBL (102d) is indicated with a reference numeral for simplicity. The four cold TBLs (102d) may receive a cooling fluid from a rack (i.e., a cold fluid plenum (420a)) via two cold TBL rack interfaces (104d). The BLA infrastructure device (100) may also comprise four hot TBLs (102e). Only one hot TBL (102e) is indicated with a reference numeral for simplicity. The four hot TBLs (102e) may pass heated exhaust fluid to a rack (i.e., to a hot fluid plenum (420b)) via two hot TBL rack interfaces (104e).

As described above, a rack is any structure that stores and connects multiple electronic devices. For example, the racks may comprise platforms that allow multiple BLA infrastructure devices (100) to be stacked vertically or horizontally. To connect to the BLA infrastructure device (100) the racks may comprise BLA interfaces. For example, a rack may comprise a cold fluid plenum (420a) that facilitates the cooling of the cartridge (FIG. 2, 210). The cold fluid plenum (420a) may comprise a number of cold TBL interfaces (422a) that interact with the cold TBL rack interfaces (104d). Similarly, a rack may comprise a hot fluid plenum (420b) that facilitates the extraction of heated fluid from the cartridge (FIG. 2, 210). The hot fluid plenum (420b) may comprise a number of hot TBL interfaces (422b) that interact with the hot TBL rack interfaces (104e). The racks may also comprise other BLA interfaces to interact with the other base layers (102). For example, a rack may comprise a PBL interface (not shown) to supply power to the PBL (102a). Similarly, a rack (420) may comprise an OBL interface (not shown) and a RBL interface (not shown) to transmit and receive optical signals and radio frequency signals to and from the OBL (102b) and the RBL (FIG. 1, 102c) respectively.

An example of the interaction between the fluid plenums (420) and a number of base layers (102) is given as follows. A cooling fluid may be supplied by the cold fluid plenum (420a) as indicated by the vertical upward arrows (424). For simplicity, one vertical upward arrow (424) is indicated with a reference numeral. The cooling fluid is then passed from the cold TBL interfaces (422a) in the rack to the cold TBLs (102d) as indicated by the horizontal arrows (312) on the right. For simplicity, one horizontal arrow (312) is identified with a reference numeral. The cooling fluid then passes to the cold TBL cartridge interfaces (FIG. 1, 106d) where it will be passed to the cartridges (FIG. 2, 210). The cooling fluid then passes to, and is distributed throughout, the cartridges (FIG. 2, 210).

After passing through, and extracting heat from the cartridges (FIG. 2, 210), the newly heated fluid is routed back to the hot TBL cartridge interfaces (FIG. 1, 106e) The heated fluid from the cartridges (FIG. 2, 210) is then expelled from the hot TBLs (102e) to the hot TBL interfaces (422b) in the rack as indicated by the horizontal arrows (318) on the left. For simplicity, one arrow (318) is indicated with a reference numeral. The heated fluid is then expelled from the hot fluid plenum (422b) as indicated by the vertical upward arrows (426). For simplicity, one vertical upward arrow (426) is identified with a reference numeral. Additionally, for simplicity, the fluid plenums (420a, 420b) are shown to be separated from the cold TBL rack interfaces (104d) and the hot TBL rack interfaces (104e) respectively. However, in use, the fluid plenums (420a, 420b) are in contact with the cold TBL rack interfaces (104d) and the hot TBL rack interfaces (104e).

A number of base layers (102) may be positioned on top of another number of base layers (102). For example, as depicted in FIG. 4, the hot TBL (102e) may be positioned on top of the cold TBL (102d). Furthermore, the PBL (102a) and the OBL (102b) may be positioned next to one another, on top of the hot TBL (102e). Lastly, as described above, one or more base layers (102) may be embedded within another base layer (102). For example, the RBL (not shown) may be embedded within the cold TBL (102d).

Figure 5:
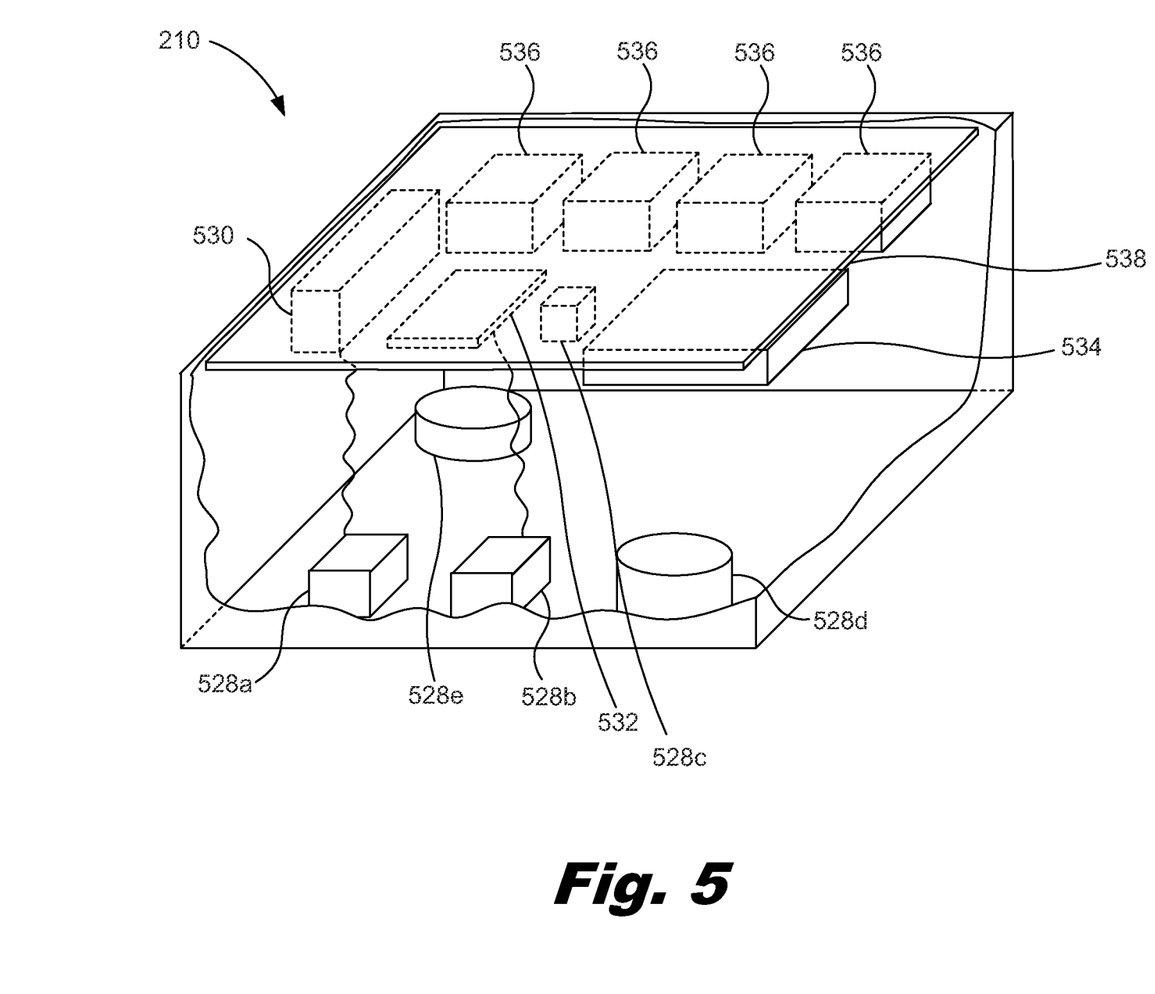
FIG. 5 is a cross-sectional view of a cartridge, according to one example of the principles described herein.

FIG. 5 is a cross-sectional view of a cartridge (210), according to one example of the principles described herein. As described above, a cartridge (210) is a modular device that carries out some functionality. For example, a compute cartridge (210) may consist of processor and memory components to perform a computing function. The cartridge (210) includes a number of base layer interfaces (528) that removably couple the cartridge (210) to the number of base layers (FIG. 1, 102). More specifically, the cartridge (210) includes a PBL interface (528a), an OBL interface (528b), a RBL interface (528c), a cold TBL interface (528d), and a hot TBL interface (528e).

Via the base layer interfaces (528) and the cartridge interfaces (FIG. 1, 106), a cartridge (210) is mechanically coupled to a number of base layers (FIG. 1, 102). The base layer interface (528) also serves to align the cartridge (210) with a base layer (FIG. 1, 102). As such, the base layer interface (528) may comprise different alignment features such as specific interface geometry and/or specific interface size to align the cartridge (210) to the number of base layer (FIG. 1, 102). In some examples, the base layer interfaces (528) may comprise blind-mate connectors to align, and mechanically couple, the cartridge (210) to the number of base layers (FIG. 1, 102). For example, the base layer interfaces (528) may comprise receptacles that receive protruding cartridge interfaces (FIG. 1, 106) on the corresponding base layers (FIG. 1, 102).

As described above, the cartridge (210) includes a PBL interface (528a) that receives power from the PBL (FIG. 1, 102a). Via the PBL interface (528a), the cartridge (210) is electrically coupled to the PBL (FIG. 1, 102a). In one example, the PBL interface (528a) is coupled to a power converter (530) that converts the received power into power level that is usable by the cartridge (210). For example, as described above, the rack may supply high voltage direct current (HVDC) to the PBL (FIG. 1, 102a). However, the cartridge (210) may utilize low voltage direct current (LVDC). Accordingly, the power converter (530) may convert the supplied HVDC into LVDC.

The cartridge (210) also includes an OBL interface (528b) that receives/transmits optical signals to/from the OBL (FIG. 1, 102b). Via the OBL interface (528b), the cartridge (210) is optically coupled to the OBL (FIG. 1, 102b). In one example, the OBL interface (528b) is coupled to an e/o engine (532) that converts electrical signals into optical signals, optical signals into electrical signals, or both. For example, the OBL interface (528b) may receive an optical signal from the OBL (FIG. 1, 102b). The optical signal is transmitted to the e/o engine (532) where it is converted into an electrical signal that can be utilized by the cartridge (210).

The cartridge (210) also includes a cold TBL interface (528d) that receives a cooling fluid from the cold TBL (FIG. 1, 102d). As described above, the cooling fluid may be liquid or air. Accordingly, the cartridge (210) may include a liquid cooling system or an air cooling system. For example, if the cooling fluid is liquid, the cartridge (210) may include a conduit that guides the cooling liquid through the cartridge (210). In another example, if the cooling fluid is air, the cartridge (210) may be designed to direct cold air through the cartridge.

The cartridge (210) also includes a hot TBL interface (528e) that removes heat from the cartridges (210). Specifically, the hot TBL interface (528e) passes heated exhaust fluid to the hot TBL (FIG. 1, 102e). As the cooling fluid is passed through the cartridge (210) excess heat is transferred to the fluid, and expelled from the cartridge (210) via the hot TBL interface (528e). Accordingly, the hot TBL interface (528e) may include a conduit or other device that directs the heated exhaust fluid out of the cartridge (210).

The cartridge (210) may also include a processor (534) to carry out the functionality of the cartridge (210). The processor (534) may be any data processing device such as, for example, microprocessors, memory controllers, and graphic processing units (GPUs), among other processing devices. For example, the processor (534) may execute instructions to perform a computing function. Accordingly, the cartridge (210) may also include memory cubes (536) that store data and/or instructions related to the operation of the cartridge (210).

As will be described in connection with FIG. 6, the cartridge (210) may also provide an interface for managing the base layers (FIG. 1, 102) and/or the cartridge (210). For example, the cartridge (210) may send feedback information to a system management device relating to the operation of the base layers (FIG. 1, 102). Based on this feedback, the system management device may manage the base layers. Examples of feedback information that the cartridge (210) could send to the computing device include, but is not limited to, cooling fluid intake temperature, cooling fluid exhaust temperature, radio frequency bandwidth, signal strength, and voltage supplied, among other feedback information. Accordingly, the memory cubes (536) may store information relating to this feedback information and the processor (534) may process and send the information to the system management device.

A number of components may be disposed on a logic board (538) of the cartridge (210). For example, as indicated in FIG. 5, the power converter (530), the e/o engine (532), the processor (534), and the memory cubes (536) may be disposed on the logic board (538). The logic board (538) may also include circuitry that connects the various components of the cartridge (210). In some examples, the logic board (538) may be horizontally oriented horizontally on a top interior surface of the cartridge (210) as depicted in FIG. 5. In other examples, the logic board (538) may be vertically oriented on an interior wall of the cartridge (210).

Figure 6:
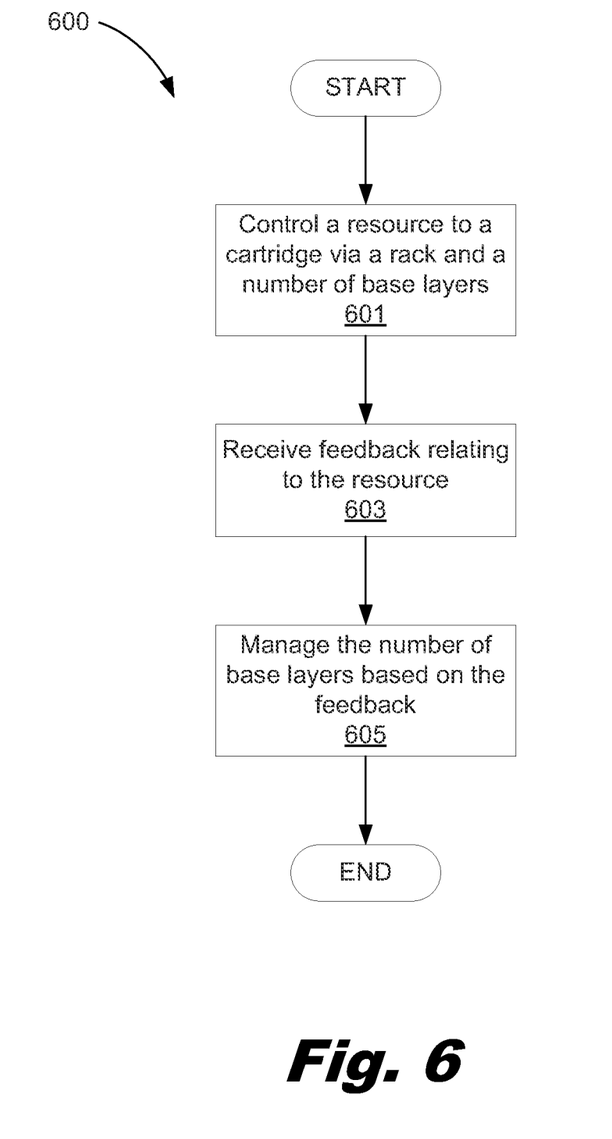
FIG. 6 is a flowchart showing a method for managing a base layer architecture infrastructure device, according to one example of principles described herein.

FIG. 6 is a flowchart showing a method 600 for managing a BLA infrastructure device (FIG. 1, 100), according to one example of principles described herein. The method (600) may be performed by a system management device (FIG. 2, 103 (schematically shown)) coupled to the BLA infrastructure device (FIG. 1, 100), a rack, or a combination thereof. The method (600) of FIG. 6 may begin by supplying (601) a resource to a cartridge (FIG. 2, 210) via a rack (FIG. 2, 105 (schematically shown)) and a number of base layers (FIG. 1, 102). As used herein, a resource facilitates the functionality of the cartridge (FIG. 2, 210). For example, power may be supplied to the cartridge (FIG. 2, 210). As described above, power may be supplied to the cartridge (FIG. 2, 210) via the PBL (FIG. 1, 102a). Another example of a resource is a data signal. For example, the system management device may transmit/receive data to/from the cartridge (FIG. 2, 210). The data may be sent as an optical signal. In this example, the system management device may supply the resource to the cartridge (FIG. 2, 210) via the OBL (FIG. 1, 102b). Data may also be sent as a radio frequency signal. In this example, the system management device may supply the resource to the cartridge (FIG. 2, 210) via the RBL (FIG. 1, 102c). In one example, high-speed signals may be transmitted via the OBL (FIG. 1, 102b) while low-speed signals may be transmitted via the RBL (FIG. 1, 102c).

Another resource that may be provided is a cooling fluid. For example, the system management device may direct a fluid source to transmit a cooling fluid to the cartridge (FIG. 2, 210) via the cold TBL (FIG. 1, 102d). As described above, examples of cooling fluids include cooling liquids and cooling air. A cooling liquid may be supplied via a conduit that runs through the cartridge (FIG. 2, 210). Similarly, cooling air may be supplied via a conduit that runs through the cartridge (FIG. 2, 210). By comparison, in some examples, cooling air may be supplied by designing the air flow of a cartridge to receive cold air and expel heated exhaust air.

Next, the method (600) may include receiving (603) feedback relating to the resource. As described above, in some examples, a cartridge (FIG. 2, 210) may include a processor (FIG. 5, 534) and memory cubes (FIG. 5, 536) that gather and store data relating to the supplied resources. For example, the cartridge (FIG. 2, 210) may identify which resources are being supplied to the cartridge (FIG. 2, 210). This information may then be sent back to the system management device, via the rack and base layers (FIG. 1, 102) for analysis and management.

Examples of other feedback that may be received includes an indication of the temperature of inlet cooling fluid and heated exhaust fluid, an indication of receipt of a signal, an indication of signal strength, and an indication of signal configuration. For example, the cartridge (FIG. 2, 210) may indicate what bandwidth of radio frequencies the cartridge may utilize. It should be noted that other forms of feedback may be sent to the system management device.

Lastly, the method (600) may include managing (605) the number of base layers (FIG. 1, 102) based on the received feedback. For example, the system management device may alter the provision of different resources based on the feedback. For example, the system management device may change the bandwidth of the radio frequency signal based on the signal configuration information received. Additionally, or alternatively, the system management device may increase the amount of cooling fluid by adjusting the flow control valves inside the cold TBL (FIG. 1, 102d) if the feedback information indicates that the cartridge (FIG. 2, 210) is too hot. In another example, the system management device may change the permissible power level for a cartridge by sending a message to the power conversion cartridge (FIG. 2, 210a). In some examples, the system management device may generate an alert message or email indicating a problem with a cartridge (FIG. 2, 210) based on the feedback. Other examples of management functions that may be carried out include, but are not limited to base layer (FIG. 1, 102) discovery, diagnostic testing, monitoring, and control functionality.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor (FIG. 5, 534) of the cartridge (FIG. 2, 210) or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The specification and figures describe a BLA infrastructure device (FIG. 1, 100). The BLA infrastructure device (FIG. 1, 100) comprises a power base layer (PBL) (FIG. 1, 102a) to supply power to a cartridge, a cold thermal base layer (cold TBL) (FIG. 1, 102d) to cool the cartridge, a hot thermal base layer (hot TBL) (FIG. 1, 102e) to remove heat from the cartridge, an optical base layer (OBL) (FIG. 1, 102b) to transmit an optical signal to the cartridge and a radio frequency base layer (RBL) (FIG. 1, 102c) to transmit a radio frequency signal to the cartridge. In some examples, the OBL (FIG. 1, 102b) and the RBL (FIG. 1, 102c) may also receive optical signals and radio frequency signals from the cartridge. Each base layer comprises a rack interface (FIG. 1, 104) to couple the base layers (FIG. 1, 102) to a rack and a number of cartridge interfaces (FIG. 1, 106) to couple the base layers (FIG. 1, 102) to the cartridge (FIG. 2, 210). A BLA infrastructure system comprises a number of BLA infrastructure devices (FIG. 1, 100) comprising a number of base layers (FIG. 1, 102). The number of base layers (FIG. 1, 102) are removably coupled to a rack and a number of cartridges (FIG. 2, 210) are removably coupled to the number of base layers (FIG. 1, 102).

The BLA infrastructure device (FIG. 1, 100) may have a number of advantages, including: (1) eliminating the need for a motherboard printed circuit board for power and signal connectivity; (2) allowing optical connectivity within a system as well as extending the same optical signals to other systems within and across racks; (3) preventing thermal shadowing due to independent and controlled micro-climate within each cartridge; (4) allowing HVDC distribution straight to the end components, enabling high efficiency in power conversion; (5) alleviating need for switches for management connectivity by using RF signals; (6) allowing for flexible component placement, signal routing, power routing, and modular serviceability in rows, racks and systems; (7) leveraging existing compressed air or liquid distribution infrastructure in data centers; (8) scalability for future bandwidth and distances; and (9) radio frequency containment for security and signal reach across sheet metal enclosures.

The preceding description has been presented to illustrate and describe examples of the principles described. This description is not intended to be exhaustive or to limit these principles to any precise form disclosed. Many modifications and variations are possible in light of the above teaching.

What is claimed is:

1. A base layer architecture (BLA) infrastructure device comprising:
    a power base layer (PBL) to supply power to a cartridge;
    a cold thermal base layer (cold TBL) to cool the cartridge;
    a hot thermal base layer (hot TBL) to remove heat from the cartridge;
    an optical base layer (OBL) to transmit an optical signal to the cartridge; and
    a radio frequency base layer (RBL) to transmit a radio frequency signal to the cartridge;
    in which the base layers each comprise:
    a rack interface to couple the base layers to a rack; and
    a number of cartridge interfaces to couple the base layers to the cartridge.

2. The infrastructure device of claim 1, in which at least two of the PBL, cold TBL, hot TBL, OBL, and RBL are incorporated into an integrated base layer and are directly connectable to a same single cartridge.

3. The infrastructure device of claim 1, further comprising a housing to house the base layers.

4. The infrastructure device of claim 1, in which a number of the cold TBL and hot TBL utilize liquid or air.

5. The infrastructure device of claim 1, in which the PBL, cold TBL, hot TBL, OBL, and RBL independently interface to the rack.

6. The infrastructure device of claim 1, in which a number of rack interfaces are consolidated into an integrated rack interface.

7. The infrastructure device of claim 1, in which a base layer is positioned on top of another base layer, to the side of another base layer, embedded in another base layer, or combinations thereof.

8. The infrastructure device of claim 1, in which a base layer comprises a number of base layer segments.

9. The infrastructure device of claim 1, wherein each of the base layers is to directly connect to a first cartridge on top of each of the base layers, the first cartridge comprising:
    a processor;
    a memory;
    a power base layer (PBL) interface to removably connect to a PBL to receive power for the cartridge;

a cold thermal base layer (cold TBL) interface to removably connect to a cold TBL to cool the cartridge;

a hot thermal base layer (hot TBL) interface to removably connect to a hot TBL to remove heat from the cartridge; and at least one of:

an optical base layer (OBL) interface to removably connect to an OBL to receive an optical signal; and a radio frequency base layer (RBL) interface to removably connect to and RBL to receive a radio frequency signal.

10. A base layer architecture (BLA) infrastructure system, comprising:

a base layer architecture (BLA) infrastructure device comprising a number of base layers to receive a number of cartridges;

a rack, in which the base layers are removably coupled to the rack; and a system management device to manage the number of base layers;

wherein each of the base layers is to directly connect to a first cartridge on top of each of the base layers, the first cartridge comprising:

a processor;

a memory;

a power base layer (PBL) interface to removably connect to a PBL to receive power for the cartridge;

a cold thermal base layer (cold TBL) interface to removably connect to a cold TBL to cool the cartridge;

a hot thermal base layer (hot TBL) interface to removably connect to a hot TBL to remove heat from the cartridge; and at least one of:

an optical base layer (OBL) interface to removably connect to an OBL to receive an optical signal; and a radio frequency base layer (RBL) interface to removably connect to and RBL to receive a radio frequency signal.

11. The BLA infrastructure system of claim 10, in which the cartridges each comprise a liquid cooling device or an air cooling device.

12. The BLA infrastructure system of claim 10, in which a number of base layers are connected to the rack via a single interface.

13. The BLA infrastructure system of claim 10, in which the base layer architecture infrastructure device comprises a power base layer (PBL), a cold thermal base layer (cold TBL), a hot thermal base layer (hot TBL), an optical base layer (OBL), a radio frequency base layer (RBL), or combinations thereof.

14. The BLA infrastructure system of claim 10, further comprising cartridge sockets defined in the BLA infrastructure device, in which the cartridge sockets receive the number of cartridges.

15. The BLA infrastructure system of claim 10, wherein each of the base layers is to directly connect to a second cartridge on top of each of the base layers alongside the first cartridge.

16. The BLA infrastructure system of claim 10, wherein each of the base layers extend alongside one another, parallel to one another.

* * * * *